(12) United States Patent
Lee et al.

(10) Patent No.: US 11,732,098 B2
(45) Date of Patent: Aug. 22, 2023

(54) LAMINATE FOR PATTERNED SUBSTRATES

(71) Applicant: LG Chem, Ltd., Seoul (KR)

(72) Inventors: Mi Sook Lee, Daejeon (KR); Se Jin Ku, Daejeon (KR); No Jin Park, Daejeon (KR); Jung Keun Kim, Daejeon (KR); Je Gwon Lee, Daejeon (KR); Hyung Ju Ryu, Daejeon (KR); Eun Young Choi, Daejeon (KR)

(73) Assignee: LG Chem, Ltd.

( * ) Notice: Subject to any disclaimer, the term of this patent is extended or adjusted under 35 U.S.C. 154(b) by 19 days.

(21) Appl. No.: 17/497,262

(22) Filed: Oct. 8, 2021

(65) Prior Publication Data

US 2022/0025138 A1 Jan. 27, 2022

Related U.S. Application Data (62) Division of application No. 16/346,669, filed as application No. PCT/KR2017/013832 on Nov. 29, 2017, now Pat. No. 11,174,360.

(30) Foreign Application Priority Data

Nov. 30, 2016 (KR) .......................... 10-2016-0162140

(51) Int. Cl.
| | | |
|---|---|---|
| *C08J 5/18* | (2006.01) | |
| *G03F 7/16* | (2006.01) | |
| *G03F 7/20* | (2006.01) | |
| *C09D 153/00* | (2006.01) | |
| *C08F 293/00* | (2006.01) | |
| *B81C 1/00* | (2006.01) | |
| *G03F 7/40* | (2006.01) | |
| *C09D 133/14* | (2006.01) | |

(52) U.S. Cl.
CPC .............. *C08J 5/18* (2013.01); *C09D 153/00* (2013.01); *G03F 7/16* (2013.01); *G03F 7/2016* (2013.01); *G03F 7/2037* (2013.01); *G03F 7/40* (2013.01); *B81C 1/00031* (2013.01); *C08F 293/005* (2013.01); *C08F 2438/03* (2013.01); *C08J 2333/14* (2013.01); *C09D 133/14* (2013.01)

(58) Field of Classification Search
CPC .......................... B81C 1/00031; B81C 1/00007
See application file for complete search history.

(56) References Cited

U.S. PATENT DOCUMENTS

| | | |
|---|---|---|
| 2009/0020924 A1 | 1/2009 | Lin |
| 2011/0059299 A1 | 3/2011 | Kim et al. |
| 2012/0107583 A1 | 5/2012 | Xiao et al. |
| 2013/0075360 A1 | 3/2013 | Nakamura et al. |
| 2013/0078576 A1 | 3/2013 | Wu et al. |
| 2014/0010990 A1 | 1/2014 | Nealey et al. |
| 2014/0273514 A1 | 9/2014 | Somervell et al. |
| 2014/0287083 A1 | 9/2014 | Gao et al. |
| 2014/0335324 A1 | 11/2014 | Kim et al. |
| 2015/0073096 A1 | 3/2015 | Navarro et al. |
| 2015/0132578 A1 | 5/2015 | Hong et al. |
| 2016/0280831 A1 | 9/2016 | Park et al. |
| 2016/0280832 A1 | 9/2016 | Kim et al. |
| 2016/0304653 A1 | 10/2016 | Kim et al. |
| 2017/0148641 A1 | 5/2017 | Tobana et al. |
| 2017/0197204 A1 | 7/2017 | Chevalier et al. |
| 2017/0210938 A1 | 7/2017 | Ku et al. |
| 2017/0219922 A1 | 8/2017 | Ku et al. |
| 2017/0250071 A1* | 8/2017 | Seino .................. H01L 21/3088 |
| 2017/0306074 A1 | 10/2017 | Lee et al. |

FOREIGN PATENT DOCUMENTS

| | | |
|---|---|---|
| CN | 103797066 A | 5/2014 |
| JP | 200836491 A | 2/2008 |
| JP | 2013073974 A | 4/2013 |
| JP | 2016528713 A | 9/2016 |
| JP | 2017537458 A | 12/2017 |
| KR | 101005300 B1 | 1/2011 |
| KR | 20140063790 A | 5/2014 |
| KR | 20140146881 A | 12/2014 |
| KR | 20150067064 A | 6/2015 |
| KR | 20160038869 A | 4/2016 |
| TW | 201539572 A | 10/2015 |
| TW | 201628061 A | 8/2016 |
| WO | 2015084120 A1 | 6/2015 |
| WO | 2016053010 A1 | 4/2016 |
| WO | 2016053014 A1 | 4/2016 |

OTHER PUBLICATIONS

International Search Report for Application No. PCT/KR2017/013832 dated Mar. 14, 2018.
Chinese Search Report for Application No. 201780072437.8, dated Mar. 1, 2021, 2 pages.

* cited by examiner

*Primary Examiner* — Jeffrey C Mullis
(74) *Attorney, Agent, or Firm* — Lerner David LLP (57) ABSTRACT

The present application relates to a block copolymer and a use thereof. The present application can provide a laminate which is capable of forming a highly aligned block copolymer on a substrate and thus can be effectively applied to production of various patterned substrates, and a method for producing a patterned substrate using the same.

11 Claims, 5 Drawing Sheets

LAMINATE FOR PATTERNED SUBSTRATES

CROSS-REFERENCE TO RELATED APPLICATIONS

The present application is a divisional application of U.S. application Ser. No. 16/346,669 filed May 1, 2019, a national phase entry under 35 U.S.C. § 371 of International Application No. PCT/KR2017/013832 filed Nov. 29, 2017, which claims priority from Korean Patent Application No. 10-2016-0162140 filed Nov. 30, 2016, all of which are incorporated herein by reference.

TECHNICAL FIELD

The present application relates to a laminate.

BACKGROUND ART

A block copolymer has a molecular structure in which polymer segments having different chemical structures are linked via covalent bonds. The block copolymer can form a periodically arranged structure such as a sphere, a cylinder or a lamella by phase separation. The domain size of the structure formed by a self-assembly phenomenon of the block copolymer can be widely controlled and various types of structures can be manufactured, so that the block copolymer can be applied to high density magnetic storage media, nanowire fabrication, various next-generation nano devices such as quantum dots or metal dots or magnetic recording media, or pattern formation by lithography, and the like.

DISCLOSURE

Technical Problem

The present application provides a laminate.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted with one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted with one or more substituents.

The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted with one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted with one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted with one or more substituents.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

The present application relates to a laminate. The laminate of the present application may be applied to a method for producing a patterned substrate. The method for producing the patterned substrate of the present application may be performed by a lithography method in which a directed self-assembly material is applied as a template, where the directed self-assembly material may be a block copolymer.

The laminate of the present application allows a self-assembled structure of the directed self-assembly material to be formed with higher precision in the process of producing the patterned substrate as above, thereby precisely performing patterning of the substrate.

The laminate of the present application comprises: a substrate; a polymer stripe pattern formed on the substrate and a block copolymer film formed on the surface of the substrate on which the polymer stripe pattern is formed.

In the laminate of the present application, no neutral treatment region may be included between the substrate and the block copolymer film. In the present application, the term neutral treatment region is a treatment region known as a so-called neutral brush layer or the like in the industry, which includes all treatment regions known as being capable of achieving the vertical orientation of the block copolymer on the substrate. That is, in the laminate of the present application, the block copolymer film may be in direct contact with the substrate or the polymer stripe pattern.

The type of the substrate included in the laminate of the present application is not particularly limited. This substrate may be etched via a mask formed by a block copolymer film in a method for manufacturing a patterned substrate to be described below. As such a substrate, for example, various types of substrates requiring formation of a pattern on the surface may all be used. This type of substrate may include, for example, a silicon substrate, a silicon germanium substrate, a GaAs substrate, a silicon oxide substrate, and the like. As the substrate, for example, a substrate applied to formation of finFETs (fin field effect transistors) or other electronic devices such as diodes, transistors or capacitors may be used. In addition, other materials such as ceramics may be used as the substrate depending on the application, and the types of substrates that can be applied in the present application are not limited thereto.

Figure 1:
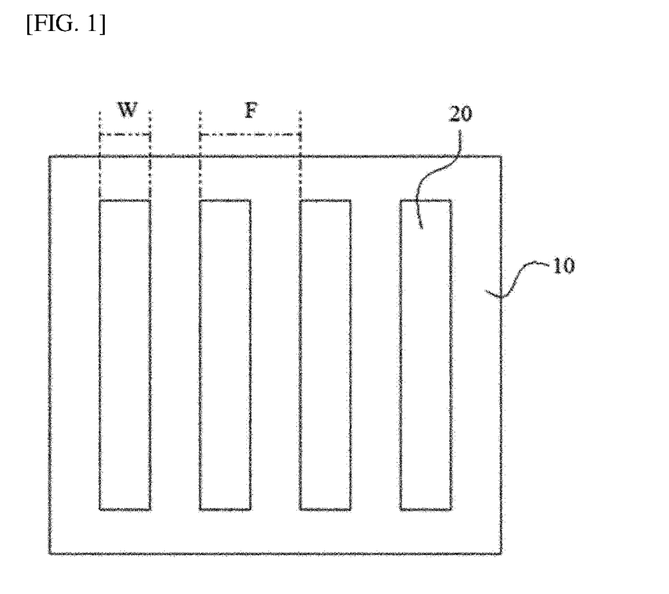
FIG. 1 is a schematic diagram of a polymer stripe pattern of the present application.

In the present application, the polymer stripe pattern is formed on the surface of the substrate as above. For example, as schematically shown in FIG. 1, the polymer stripe pattern means a form in which two or more stripe shaped polymer films (20) are formed on the surface of the substrate (10) to form a pattern.

The block copolymer film is formed on the surface of the substrate on which the polymer stripe pattern as above is formed. In the block copolymer film, the block copolymer forms a self-assembled structure. The type of the self-assembled structure formed by the block copolymer is not particularly limited, which may be a known self-assembled structure, for example, a structure such as a sphere, a cylinder or a lamella, and in one example, may be a lamellar structure.

The present inventors have confirmed that a highly precise self-assembled structure can be formed on a substrate by controlling the polymer stripe pattern and the type and shape of the block copolymer in the structure of such a laminate, as described below.

For example, the shape of the polymer stripe pattern in the laminate can be controlled as follows.

For example, when the self-assembled structure formed by the block copolymer in the block copolymer film of the laminate is a lamellar structure, the polymer stripe pattern may have a stripe width of 0.3 L to 2.0 L, 0.3 L to 1.8 L, 0.3 L to 1.6 L, 0.3 L to 1.4 L, 0.3 L to 1.2 L, 0.3 L to 1.0 L, 0.3 L to 0.8 L, 0.3 L to 0.7 L, 0.4 L to 0.6 L or about 0.5 L to 0.6 L, or about 0.5 L or so. Here, L is a pitch of the lamellar structure formed by the block copolymer. Also, here, the stripe width is indicated by W in FIG. 1, for example.

Furthermore, the ratio (F/W) of the stripe pitch (F) to the stripe width (W) in the polymer stripe pattern may be in a range of 2 to 20. Here, the stripe pitch is a distance between the start point of any one stripe and the start point of another stripe adjacent thereto, which is indicated by F in FIG. 1. In another example, the ratio (F/W) may be about 3 or more, 4 or more, 5 or more, 6 or more, 7 or more, 8 or more, 9 or more, 10 or more, 11 or more, 12 or more or 13 or more, or 14 or more, or may be about 19 or less, 18 or less, 17 or less, or 16 or less.

In the laminate, the polymer stripe pattern may have a thickness of 50 nm or less. In another example, the thickness of the polymer stripe pattern may be about 45 nm or less, about 40 nm or less, about 35 nm or less, about 30 nm or less, about 25 nm or less, about 20 nm or less, about 15 nm or less, or about 10 nm or less, and optionally, may be about 0.5 nm or more, about 1 nm or more, about 2 nm or more, about 3 nm or more, about 4 nm or more, about 5 nm or more, about 6 nm or more, about 7 nm or more, about 8 nm or more, or about 9 nm or more.

In another example, the thickness of the polymer stripe pattern may be 1 L or less. In another example, the thickness of the polymer stripe pattern may be about 0.9 L or less, about 0.8 L or less, about 0.7 L or less, or about 0.6 L or less, and optionally, may be about 0.01 L or more, 0.05 L or more, 0.1 L or more, 0.2 L or more, 0.3 L or more, 0.4 L or more, or about 0.5 L or more. In such a range, appropriate effects may be exhibited. Here, L is a pitch of the lamellar structure formed by the block copolymer.

In the laminate, the thickness of the block copolymer film can be adjusted in the range of 1 L to 10 L. Here, L is a pitch of the lamellar structure formed by the block copolymer. In another example, the thickness may be about 9 L or less, 8 L or less, 7 L or less, 6 L or less, 5 L or less, 4 L or less, 3 L or less or 2 L or less.

The polymer segment A contained in such a laminate and the polymer segment B different from the polymer segment A may be included.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. Here, the monomer unit that the polymer segment comprises as a main component is a monomer unit in which 60% or more, 65% or more, 70% or more, 75% or more, 80% or more, 85% or more, or 90% or more is included and 100% or less is included in the corresponding polymer segment. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100× 2/5). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40− 30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

The respective polymer segments of the block copolymer may be formed by only one monomer, or may be formed by two or more of monomers. The block copolymer may be a diblock copolymer comprising only one polymer segment A and one polymer segment B. The block copolymer may also be a block copolymer of three blocks or more which comprises each one of the polymer segments A and B, and further comprises any one or both of the polymer segments A and B, or further comprises other polymer segments rather than the polymer segments A and B.

The block copolymer comprises two or more polymer segments connected by covalent bonds, and thus phase separation occurs and a so-called self-assembled structure is formed. The present inventors have confirmed that the block copolymer can be more effectively applied in the laminate by satisfying any one or two or more of conditions to be described below. Accordingly, the block copolymer of the present application may satisfy at least one of the following conditions. The conditions described below are in parallel, and any one condition does not override the other conditions. The block copolymer may satisfy any one condition selected from the conditions described below, or may satisfy two or more conditions. Through the fulfillment of any one condition, the block copolymer can exhibit more effectively vertical orientation in the above-described laminate. In the present application, the term vertical orientation indicates the orientation of the block copolymer, where the orientation of the phase separation structure or the self-assembled structure formed by the block copolymer may mean an orientation perpendicular to the substrate direction, and for example, may mean a case where the interface between the domain formed by a polymer segment A and the domain formed by a polymer segment B, which are described below, of the block copolymer is perpendicular to the surface of the substrate. In the present application, the term vertical is an expression in consideration of an error, which may be a meaning including, for example, errors within ±10 degrees, ±8 degrees, ±6 degrees, ±4 degrees or ±2 degrees.

An exemplary block copolymer of the present application comprises a polymer segment A and a polymer segment B different from the polymer segment A, wherein the block copolymer or the polymer segment A may exhibit a melting transition peak or an isotropic transition peak in a range of −80° C. to 200° C. in a DSC analysis (Condition 1).

An exemplary block copolymer of the present application comprises a polymer segment A and a polymer segment B different from the polymer segment A, wherein the block copolymer or the polymer segment A may exhibit a peak having a half-value width in a range of 0.2 to 0.9 $nm^{-1}$ within a scattering vector (q) range of 0.5 $nm^{-1}$ to 10 $nm^{-1}$ upon an XRD analysis (Condition 2).

An exemplary block copolymer of the present application comprises a polymer segment A and a polymer segment B different from the polymer segment A, wherein the polymer segment A may comprise a side chain and the number (n) of chain-forming atoms in the side chain and the scattering vector (q) obtained by the XRD analysis of the polymer segment A may satisfy Equation 1 below (Condition 3).

$$3 \text{ nm}^{-1} \text{ to } 5 \text{ nm}^{-1} = nq/(2 \times \pi)$$ [Equation 1]

In Equation 1, n is a number of chain-forming atoms of the side chain, and q is the smallest scattering vector (q) in which the peak is observed in the X-ray diffraction analysis for the polymer segment containing the side chain, or the scattering vector (q) in which the peak of the largest peak area is observed.

An exemplary block copolymer of the present application comprises a polymer segment A and a polymer segment B different from the polymer segment A, wherein the absolute value of the difference between the surface energy of the polymer segment A and the surface energy of the polymer segment B may be 10 mN/m or less (Condition 4).

An exemplary block copolymer of the present application comprises a polymer segment A and a polymer segment B different from the polymer segment A, wherein the absolute value of the difference in density between the polymer segment A and the polymer segment B may be 0.25 $g/cm^3$ or more (Condition 5).

In the respective block copolymers, the polymer segment A may be a polymer segment comprising a side chain as described below.

Hereinafter, each of the conditions will be described in detail.

In this specification, physical properties, such as density, that can be changed by temperature are values measured at room temperature, unless otherwise specified. The term room temperature is a natural temperature without warming or cooling, which may mean a temperature of about 10° C. to 30° C., about 25° C. or about 23° C.

Also, in this specification, unless otherwise specified, the unit of temperature is ° C.

A. Condition 1

The block copolymer of the present application or any one polymer segment of the block copolymer may exhibit a melting transition peak or isotropic transition peak in a range of −80° C. to 200° C. in a DSC (differential scanning calorimetry) analysis. The block copolymer or any one polymer segment of the block copolymer may also exhibit only any one peak of the melting transition peak or the isotropic transition peak, or may exhibit both of the two peaks. Such a block copolymer may be a copolymer exhibiting a crystal phase and/or a liquid crystal phase suitable for self-assembly as a whole or comprising a polymer segment exhibiting such a crystal phase and/or a liquid crystal phase. The polymer segment satisfying Condition 1 above may be a polymer segment A.

The block copolymer exhibiting the above-described DSC behavior or any one polymer segment of the block copolymer may further satisfy the following conditions.

For example, when the isotropic transition peak and the melting transition peak appear simultaneously, the difference (Ti−Tm) between the temperature (Ti) at which the isotropic transition peak appears and the temperature (Tm) at which the melting transition peak appears may be in a range of 5° C. to 70° C. In another example, the difference (Ti−Tm) may be 10° C. or more, 15° C. or more, 20° C. or more, 25° C. or more, 30° C. or more, 35° C. or more, 40° C. or more, 45° C. or more, 50° C. or more, 55° C. or more, or 60° C. or more. The block copolymer having a difference (Ti−Tm) between the temperature (Ti) of the isotropic transition peak and the temperature (Tm) of the melting transition peak in the above range or the block copolymer comprising such a polymer segment can maintain excellent phase separation or self-assembly characteristics.

In another example, when the isotropic transition peak and the melting transition peak appear simultaneously, the ratio (M/I) of the area (I) of the isotropic transition peak and the area (M) of the melting transition peak may be in a range of 0.1 to 500. In the DSC analysis, the block copolymer having a ratio (M/I) of the area (I) of the isotropic transition peak and the area (M) of the melting transition peak in the above range or the block copolymer comprising such a polymer segment can maintain excellent phase separation or self-assembly characteristics. In another example, the ratio (M/I) may be 0.5 or more, 1 or more, 1.5 or more, 2 or more, 2.5 or more, or 3 or more. In another example, the ratio (M/I) may be 450 or less, 400 or less, 350 or less, 300 or less, 250 or less, 200 or less, 150 or less, 100 or less, 90 or less, or 85 or less.

A method of performing the DSC analysis is known, and in the present application, the above analysis can be performed by such a known method.

The temperature (Tm) range at which the melting transition peak appears may be a range of −10° C. to 55° C. In another example, the temperature (Tm) may be 50° C. or less, 45° C. or less, 40° C. or less, 35° C. or less, 30° C. or less, 25° C. or less, 20° C. or less, 15° C. or less, 10° C. or less, 5° C. or less, or 0° C. or less.

The block copolymer may comprise a polymer segment having a side chain, as described below. In this case, the block copolymer may satisfy Equation 2 below.

$$10° C. \leq Tm-12.25° C. \times n+149.5° C. \leq 10° C.$$ [Equation 2]

In Equation 2, Tm is a temperature at which a melting transition peak of the block copolymer or the polymer segment having the side chain appears, and n is a number of chain-forming atoms of the side chain.

The block copolymer satisfying Equation above may have excellent phase separation or self-assembly properties.

In another example, Tm−12.25° C.×n+149.5° C. in Equation 2 may be −8° C. to 8° C., −6° C. to 6° C., or about −5° C. to 5° C. or so.

B. Condition 2

The block copolymer of the present application may comprise a polymer segment showing at least one peak in a predetermined range of the scattering vector (q) upon the XRD analysis (X-ray diffraction analysis). The polymer segment satisfying Condition 2 may be the polymer segment A.

For example, any one polymer segment of the block copolymer may exhibit at least one peak in a scattering vector (q) range of 0.5 $nm^{-1}$ to 10 $nm^{-1}$ in the X-ray diffraction analysis. In another example, the scattering vector (q) at which the peak appears may be 0.7 $nm^{-1}$ or more, 0.9 $nm^{-1}$ or more, 1.1 $nm^{-1}$ or more, 1.3 $nm^{-1}$ or more, or 1.5 $nm^{-1}$ or more. In another example, the scattering vector (q) at which the peak appears may be 9 $nm^{-1}$ or less, 8 $nm^{-1}$ or less, 7 $nm^{-1}$ or less, 6 $nm^{-1}$ or less, 5 $nm^{-1}$ or less, 4 $nm^{-1}$ or less, 3.5 $nm^{-1}$ or less, or 3 $nm^{-1}$ or less. The half-value width (full width at half maximum, FWHM) of the peak identified in the above scattering vector (q) range may be in the range of 0.2 to 0.9 $nm^{-1}$. In another example, the half-value width may be 0.25 $nm^{-1}$ or more, 0.3 $nm^{-1}$ or more, or 0.4 $nm^{-1}$ or more. In another example, the half-value width may be 0.85 $nm^{-1}$ or less, 0.8 $nm^{-1}$ or less, or 0.75 $nm^{-1}$ or less.

In Condition 2, the term half-value width may mean a width of the peak (the difference in the scattering vector (q)) at a position showing the ½ intensity of the maximum peak intensity.

The scattering vector (q) and the half-value width in the XRD analysis are values obtained by a numerical analytical method in which the results obtained by the XRD analysis to be described below are applied by a least-square method. In the method, the profile of the XRD patterns is subjected to Gaussian fitting in a state where a portion showing the smallest intensity in the XRD diffraction patterns is taken as a baseline and the intensity in the above is set to zero, and then the scattering vector and the half-value width can be obtained from the fitted results. The R square at the time of Gaussian fitting is at least 0.9 or more, 0.92 or more, 0.94 or more, or 0.96 or more. A method capable of obtaining the information as above from the XRD analysis is known, and for example, a numerical analysis program such as origin can be applied.

The polymer segment showing the peak of the half-value width in the above scattering vector (q) range may comprise a crystalline site suitable for self-assembly. The block copolymer comprising the polymer segment identified in the above-described scattering vector (q) range may exhibit excellent self-assembly properties.

The XRD analysis can be performed by transmitting X-rays to a sample and then measuring the scattering intensity according to the scattering vector. The XRD analysis can be performed using a polymer prepared by polymerizing only a monomer constituting any one polymer segment of the block copolymer, for example, the polymer segment A. The XRD analysis can be performed on such a polymer without any special pretreatment, and for example, can be performed by drying the polymer under appropriate conditions and then passing it through X-rays. As the X-ray, an X-ray having a vertical size of 0.023 mm and a horizontal size of 0.3 mm can be applied. The scattering vector and the half-value width can be obtained by obtaining as an image 2D diffraction patterns that are scattered in the sample and exited using a measuring instrument (for example, 2D marCCD), and fitting the obtained diffraction pattern with the above-described manner.

C. Condition 3

The block copolymer of the present application may comprise, as the polymer segment A, a polymer segment having a side chain to be described below, wherein the number (n) of chain-forming atoms of the side chain can satisfy Equation 1 below with the scattering vector (q) obtained by the X-ray diffraction analysis performed in the same manner as in Condition 2 above.

$$3\ nm^{-1}\ to\ 5\ nm^{-1} = nq/(2 \times \pi)$$ [Equation 1]

In Equation 1, n is a number of the chain-forming atoms, and q is the smallest scattering vector (q) in which the peak is observed in the X-ray diffraction analysis for the polymer segment containing the side chain, or the scattering vector (q) in which the peak of the largest peak area is observed. Also, in Equation 1, π means the circular constant.

The scattering vector or the like introduced into Equation 1 is a value obtained by the same manner mentioned in the above-described X-ray diffraction analysis method.

The scattering vector (q) introduced in Equation 1 may be, for example, a scattering vector (q) in a range of 0.5 $nm^{-1}$ to 10 $nm^{-1}$. In another example, the scattering vector (q) introduced into Equation 1 may be 0.7 $nm^{-1}$ or more, 0.9 $nm^{-1}$ or more, 1.1 $nm^{-1}$ or more, 1.3 $nm^{-1}$ or more, or 1.5 $nm^{-1}$ or more. In another example, the scattering vector (q) introduced into Equation 1 above may be 9 $nm^{-1}$ or less, 8 $nm^{-1}$ or less, 7 $nm^{-1}$ or less, 6 $nm^{-1}$ or less, 5 $nm^{-1}$ or less, 4 $nm^{-1}$ or less, 3.5 $nm^{-1}$ or less, or 3 $nm^{-1}$ or less.

When a polymer composed of only the polymer segment comprising the side chain of the block copolymer has formed a film, Equation 1 shows a relationship of the distance (D) between the polymer main chains containing the side chains and the number of chain-forming atoms in the side chain, and when the number of chain-forming atoms of the side chain in the polymer having the side chain satisfies Equation 1 above, the crystallinity represented by the side chain is increased, whereby the phase separation property or the vertical orientation can be significantly improved. In another example, the nq/(2×π) according to Equation 1 above may also be 4.5 nm$^{-1}$ or less. Here, the distance (D, unit: nm) between the polymer main chains in which the side chains are contained can be calculated by the equation D=2×π/q, where D is the distance (D, unit: nm), and π and q are as defined in Equation 1.

D. Condition 4

The absolute value of the difference between the surface energy of the polymer segment A and the surface energy of the polymer segment B in the block copolymer of the present application may be 10 mN/m or less, 9 mN/m or less, 8 mN/m or less, 7.5 mN/m or less, or 7 mN/m or less. The absolute value of the difference in surface energy may be 1.5 mN/m, 2 mN/m or 2.5 mN/m or more. The structure in which the polymer segments A and B having the absolute value of the difference in surface energy in this range are connected by covalent bonds can induce effective microphase separation. Here, the polymer segment A may be, for example, a polymer segment having a side chain as described below.

The surface energy can be measured using a drop shape analyzer (DSA100 product from KRUSS). Specifically, the surface energy can be measured for a film in which a coating liquid obtained by diluting a target sample (block copolymer or homopolymer), which is measured, in fluorobenzene to a solid concentration of about 2 wt %, is coated on a substrate to a thickness of about 50 nm and a coating area of 4 cm$^2$ (width: 2 cm, height: 2 cm), and dried at room temperature for about 1 hour, and then subjected to thermal annealing at 160° C. for about 1 hour. The process of dropping the deionized water whose surface tension is known on the film subjected to the thermal annealing and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer can be obtained for a homopolymer made of only the monomer forming the polymer segment by the above-described method.

When the block copolymer comprises the above-described side chain, the polymer segment comprising the side chain may have a higher surface energy than the other polymer segment. For example, if the polymer segment A of the block copolymer comprises the side chain, the polymer segment A may have a higher surface energy than the polymer segment B. In this case, the surface energy of the polymer segment A may be in a range of about 20 mN/m to 40 mN/m. The surface energy of the polymer segment A may be 22 mN/m or more, 24 mN/m or more, 26 mN/m or more, or 28 mN/m or more. The surface energy of the polymer segment A may be 38 mN/m or less, 36 mN/m or less, 34 mN/m or less, or 32 mN/m or less. The block copolymer comprising such a polymer segment A and exhibiting a difference in surface energy from the polymer segment B as above can exhibit excellent self-assembly properties.

E. Condition 5

The absolute value of the difference in density between the polymer segment A and the polymer segment B in the block copolymer may be 0.25 g/cm$^3$ or more, 0.3 g/cm$^3$ or more, 0.35 g/cm$^3$ or more, 0.4 g/cm$^3$ or more, or 0.45 g/cm$^3$ or more. The absolute value of the difference in density may be 0.9 g/cm$^3$ or more, 0.8 g/cm$^3$ or less, 0.7 g/cm$^3$ or less, 0.65 g/cm$^3$ or less, or 0.6 g/cm$^3$ or less. The structure in which the polymer segment A and the polymer segment B having the absolute value of the density difference in this range are linked by covalent bonds can induce effective microphase separation by phase separation due to proper non-compatibility.

The density of each polymer segment in the block copolymer can be measured using a known buoyancy method, and for example, the density can be measured by analyzing the mass of the block copolymer in a solvent, such as ethanol, which is known in mass and density in air.

When the above-described side chain is included, the polymer segment comprising the side chain may have a lower density than the other polymer segment. For example, if the polymer segment A of the block copolymer comprises the side chain, the polymer segment A may have a lower density than the polymer segment B. In this case, the density of the polymer segment A may be in a range of about 0.9 g/cm$^3$ to 1.5 g/cm$^3$ or so. The density of the polymer segment A may be 0.95 g/cm$^3$ or more. The density of the polymer segment A may be 1.4 g/cm$^3$ or less, 1.3 g/cm$^3$ or less, 1.2 g/cm$^3$ or less, 1.1 g/cm$^3$ or less, or 1.05 g/cm$^3$ or less. The block copolymer comprising such a polymer segment A and exhibiting a density difference with the polymer segment B as above can exhibit excellent self-assembly properties.

As described above, the block copolymer may satisfy any one of the above conditions, or may satisfy two or more selected from them.

In one example, the block copolymer may comprise a polymer segment A satisfying any one or two or more of Conditions 1 to 3 among the above conditions and a polymer segment B having a difference in surface energy according to Condition 4 above.

Although not limited by theory, the polymer segment A satisfying any one of Conditions 1 to 3 can exhibit crystallinity or liquid crystallinity, and accordingly, it can be packed with regularity upon forming the self-assembled structure. In this state, when the polymer segment A and the polymer segment B satisfy the difference in surface energy according to Condition 4, the domains formed by the respective polymer segments A and B are substantially neutralized, whereby the film can be oriented vertically in the structure of the above-mentioned laminate even if there is no neutral treatment region.

In the block copolymer, the volume fraction of the polymer segment A may be in a range of 0.4 to 0.8, and the volume fraction of the polymer segment B may be in a range of 0.2 to 0.6. The sum of the volume fractions of the polymer segments A and B may be 1. In another example, the volume fraction of the polymer segment A may be about 0.75 or less, about 0.7 or less, about 0.65 or less, about 0.6 or less, about 0.55 or less, or about 0.5 or less. Also, the volume fraction of the polymer segment B may be about 0.25 or more, about 0.3 or more, about 0.35 or more, about 0.4 or more, about 0.45 or more, or about 0.5 or more. The block copolymer comprising each of the above-mentioned segments at the above volume fractions may exhibit excellent self-assembly properties in the laminate. The volume fraction of each block in the block copolymer can be determined based on the density and the molecular weight measured by GPC (gel permeation chromatography), of each block.

As other conditions, the block copolymer may have a number average molecular weight (Mn) in a range of, for example, 3,000 to 300,000. In this specification, the term number average molecular weight is a converted value for standard polystyrene measured using GPC (gel permeation chromatograph), and the term molecular weight herein means a number average molecular weight, unless otherwise specified. Unless otherwise specified, the unit of number average molecular weight is also g/mol. In another example, the molecular weight (Mn) may be, for example, 3000 or more, 5000 or more, 7000 or more, 9000 or more, 11000 or more, 13000 or more, or 14000 or more. In another example, the molecular weight (Mn) may be 250000 or less, 200000 or less, 180000 or less, 160000 or less, 140000 or less, 120000 or less, 90000 or less, 80000 or less, 70000 or less, 60,000 or less, 50000 or less, 40000 or less, 30000 or less, 25000 or less, 20000 or less, or 15000 or less. The block copolymer may have a polydispersity (Mw/Mn) in a range of 1.01 to 1.60. In another example, the polydispersity may be about 1.1 or more, about 1.2 or more, about 1.3 or more, or about 1.4 or more.

In this range, the block copolymer may exhibit proper self-assembly properties. The number average molecular weight of the block copolymer or the like can be adjusted in consideration of the desired self-assembled structure and the like.

The above-mentioned conditions can be achieved, for example, by controlling the structure of the block copolymer. For example, the polymer segment A of the block copolymer satisfying one or more of the above-mentioned conditions may comprise the side chain to be described below. The polymer segment A may comprise a ring structure, where the side chain may be substituted on the ring structure. The side chain may be directly substituted on the ring structure or may be substituted via a suitable linker. The ring structure may be an aromatic structure or an alicyclic ring structure as described above. No halogen atom may be present in such a ring structure. The polymer segment B contained in the block copolymer together with the polymer segment A may comprise 3 or more halogen atoms. At this time, the polymer segment B may comprise a ring structure, where the halogen atoms may be substituted on the ring structure. The ring structure may be an alicyclic ring structure or an aromatic structure as described above.

Here, the aromatic structure or the alicyclic ring structure may be a structure contained in the main chain of the polymer segment, or may be a structure linked to the polymer segment main chain in a side chain form.

In one example, the block copolymer satisfying one or more of the above conditions may comprise a polymer segment A comprising a side chain and a polymer segment B different therefrom. Here, the side chain may be a side chain having 8 or more chain-forming atoms, as described below. The polymer segment A may be a polymer segment satisfying any one of the above-described conditions 1 to 3, satisfying two or more of the foregoing, or satisfying all of the above conditions.

Here, the term side chain means a chain connected to the main chain of the polymer, and the term chain-forming atom is an atom forming the side chain, which means an atom forming the straight chain structure of the chain. The side chain may be linear or branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not included in the calculation. For example, in the case of a side chain, the number of chain-forming atoms can be calculated as the number of chain-forming atoms forming the longest chain moiety. For example, when the side chain is an n-pentyl group, all of the chain-forming atoms are carbon atoms and the number thereof is 5, and even when the side chain is a 2-methylpentyl group, all of the chain-forming atoms are carbon atoms and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain-forming atoms may be 30 or less, 25 or less, 20 or less, or 16 or less.

For the control of the above-described conditions, the polymer segment A of the block copolymer may have a chain with 8 or more chain-forming atoms connected to the side chain. In this specification, the term chain and side chain may refer to the object identical to each other.

The side chain may be a chain comprising 8 or more, 9 or more, 10 or more, 11 or more, or 12 or more chain-forming atoms, as mentioned above. Also, the number of the chain-forming atoms may be 30 or less, 25 or less, 20 or less, or 16 or less. The chain-forming atom may be a carbon, oxygen, nitrogen or sulfur atom and may suitably be carbon or oxygen.

As the side chain, a hydrocarbon chain such as an alkyl group, an alkenyl group or an alkynyl group can be exemplified. At least one of the carbon atoms of the hydrocarbon chain may be replaced by a sulfur atom, an oxygen atom or a nitrogen atom.

When the side chain is connected to the ring structure, the chain may be directly connected to the ring structure or may be connected via a linker. The linker may be exemplified by an oxygen atom, a sulfur atom, —$NR_1$—, —$S(=O)_2$—, a carbonyl group, an alkylene group, an alkenylene group, an alkynylene group, —C(=O)—$X_1$— or —$X_1$—C(=O)—. Here, $R_1$ may be hydrogen, an alkyl group, an alkenyl group, an alkynyl group, an alkoxy group or an aryl group, and $X_1$ may be a single bond, an oxygen atom, a sulfur atom, —$NR_2$—, —$S(=O)_2$—, an alkylene group, an alkenylene group or an alkynylene group, where $R_2$ may be hydrogen, an alkyl group, an alkenyl group, an alkynyl group, an alkoxy group or an aryl group. The suitable linker may be exemplified by an oxygen atom. The side chain may be connected to a ring structure such as an aromatic structure, for example, via an oxygen atom or a nitrogen atom.

When the ring structure such as the aromatic structure described above is connected to the main chain of the polymer segment in a side chain form, the aromatic structure may also be directly connected to the main chain or may be connected via a linker. In this case, the linker can be exemplified by an oxygen atom, a sulfur atom, —$S(=O)_2$—, a carbonyl group, an alkylene group, an alkenylene group, an alkynylene group, —C(=O)—$X_1$— or —$X_1$—C(=O)—, where $X_1$ may be a single bond, an oxygen atom, a sulfur atom, —$S(=O)_2$—, an alkylene group, an alkenylene group or an alkynylene group. The suitable linker connecting the aromatic structure to the main chain can be exemplified by —C(=O)—O— or —O—C(=O)—, but is not limited thereto.

In another example, the ring structure such as the aromatic structure contained in the polymer segment B of the block copolymer may comprise 1 or more, 2 or more, 3 or more, 4 or more, or 5 or more halogen atoms. The number of halogen atoms may be, for example, 30 or less, 25 or less, 20 or less, 15 or less, or 10 or less. The halogen atom may be exemplified by fluorine or chlorine, and the like, and the use of a fluorine atom may be advantageous. As described above, the polymer segment having a ring structure such as an aromatic structure containing a halogen atom can efficiently realize a phase separation structure through proper interaction with other polymer segments.

Here, the polymer segment A may be, for example, a polymer segment comprising a unit represented by Formula 1 below. The polymer segment may be a polymer segment containing a unit of Formula 1 below as a main component. In this specification, the fact that any polymer segment comprises a certain unit as a main component may mean a case where the polymer segment comprises the unit 60% or more, 70% or more, 80% or more, 90% or more, or 95% or more by weight, or a case where it comprises the unit 60 mol % or more, 70 mol % or more, 80 mol % or more, 90 mol % or more, or 95 mol % or more.

[Formula 1]

In Formula 1, R is hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent comprising a ring structure to which the side chain having 8 or more chain-forming atoms is linked.

When the side chain is an alkyl group, the alkyl group may contain 8 or more, 9 or more, 10 or more, 11 or more, or 12 or more carbon atoms, where the number of carbon atoms of this alkyl group may be 30 or less, 25 or less, 20 or less, or 16 or less. Also, when the side chain is an alkenyl group or alkynyl group, it may contain 8 or more, 9 or more, 10 or more, 11 or more, or 12 or more carbon atoms, where the number of carbon atoms of this alkenyl group or alkynyl group may be 30 or less, 25 or less, 20 or less, or 16 or less.

In another example, X of Formula 1 may be —C(=O)O— or —OC(=O)—.

In Formula 1, Y is a substituent comprising the above-described side chain, which may be, for example, a substituent containing an aromatic structure having 6 to 18 carbon atoms or 6 to 12 carbon atoms. Here, the chain may be, for example, a linear alkyl group containing 8 or more, 9 or more, 10 or more, 11 or more, or 12 or more carbon atoms. This alkyl group may contain 30 or less, 25 or less, 20 or less, or 16 or less carbon atoms. Such a chain may be linked to the aromatic structure directly or via the above-mentioned linker.

In another example, the unit of Formula 1 above in the polymer segment A may be a unit of Formula 2 below.

[Formula 2]

In Formula 2, R is hydrogen or an alkyl group having 1 to 4 carbon atoms, X is —C(=O)—O—, P is an arylene group having 6 to 12 carbon atoms, Q is an oxygen atom, and Z is the side chain having 8 or more chain-forming atoms.

In another example, P in Formula 2 may be phenylene, and in another example, Z may be a linear alkyl group having 9 to 20 carbon atoms, 9 to 18 carbon atoms, 9 to 16 carbon atoms, 10 to 16 carbon atoms, 11 to 16 carbon atoms or 12 to 16 carbon atoms. Here, when P is phenylene, Q may be connected to the para position of the phenylene. Here, the alkyl group, arylene group, phenylene group and side chain may be optionally substituted with one or more substituents.

The polymer segment B of the block copolymer may be, for example, a polymer segment containing a unit represented by Formula 3 below. The polymer segment may comprise a unit of Formula 3 below as a main component.

[Formula 3]

In Formula 3, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group, and W is an aryl group containing at least one halogen atom.

In another example, X$_2$ of Formula 3 may be a single bond or an alkylene group.

In Formula 3, the aryl group of W may be an aryl group having 6 to 12 carbon atoms or a phenyl group, and this aryl group or phenyl group may contain 1 or more, 2 or more, 3 or more, 4 or more, or 5 or more halogen atoms. Here, the number of halogen atoms may be, for example, 30 or less, 25 or less, 20 or less, 15 or less, or 10 or less. As the halogen atom, a fluorine atom may be exemplified.

In another example, the unit of Formula 3 may be represented by Formula 4 below.

[Formula 4]

In Formula 4, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, $R_1$ to $R_5$ are each independently hydrogen, an alkyl group, a haloalkyl group or a halogen atom, and the number of halogen atoms contained in $R_1$ to $R_5$ is 1 or more.

In Formula 4, $R_1$ to $R_5$ may be each independently a hydrogen atom, an alkyl group having 1 to 4 carbon atoms or a haloalkyl group having 1 to 4 carbon atoms or halogen, where halogen may be chlorine or fluorine.

In Formula 4, 2 or more, 3 or more, 4 or more, 5 or more, or 6 or more of $R_1$ to $R_5$ may contain halogen. The upper limit of the halogen number is not particularly limited and may be, for example, 12 or less, 8 or less, or 7 or less.

As described above, the block copolymer may be a diblock copolymer comprising any two of the above units, or may be a block copolymer comprising any one or both of the two polymer segments together with other polymer segments.

The method of producing such a block copolymer is not particularly limited. The block copolymer may be polymerized by, for example, an LRP (Living Radical Polymerization) method, and an example thereof includes anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

For example, the block copolymer can be prepared in a manner comprising polymerizing a reactant comprising monomers capable of forming the polymer segments in the presence of a radical initiator and a living radical polymerization reagent by a living radical polymerization method. The process of producing the polymer segment copolymer may further comprise, for example, a process of precipitating the polymerization product produced through the above processes in a non-solvent.

The kind of the radical initiator is not particularly limited, which may be appropriately selected in consideration of polymerization efficiency, and for example, an azo compound such as AIBN (azobisisobutyronitrile) or 2,2'-azobis-(2,4-dimethylvaleronitrile), or peroxide series such as BPO (benzoyl peroxide) or DTBP (di-t-butyl peroxide) may be used.

The living radical polymerization process may be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethyl sulfoxide or dimethylacetamide.

As the non-solvent, an alcohol such as methanol, ethanol, normal propanol or isopropanol, a glycol such as ethylene glycol, n-hexane, cyclohexane, n-heptane or ether series such as petroleum ether can be used, without being limited thereto.

On the other hand, in the laminate, the polymer forming the stripe pattern may be a polymer satisfying any one or two or more of Conditions 1 to 3 above, or may be a polymer in which the absolute value of the difference in surface energy between the polymer segment A and the polymer segment A is 10 mN/m or less. Here, the difference in surface energy may be 9 mN/m or less, 8 mN/m or less, 7.5 mN/m or less, or 7 mN/m or less. The absolute value of the difference in surface energy may be 1.5 mN/m, 2 mN/m or 2.5 mN/m or more.

As the above-mentioned stripe pattern is formed by applying such a polymer, the block copolymer in the laminate can more effectively realize the self-assembled structure. The kind of the polymer is not particularly limited. For example, the polymer satisfying any one or two or more of Conditions 1 to 3 above may be the above-mentioned polymer segment A, and the polymer, in which the absolute value of the difference in surface energy with the polymer segment A is 10 mN/m or less, may be the above-mentioned polymer segment B. Therefore, the polymer may be a polymer containing the above-described unit of Formula 1 or 2 as a main component, or may be a polymer containing the above-described unit of Formula 3 or 4 as a main component.

In one example, the polymer forming the polymer stripe pattern may have a molecular weight (Mn (Number Average Molecular Weight)), for example, in a range of 8,000 to 100,000. Under such a range, desired excellent results can be ensured.

The present application also relates to a method for producing a patterned substrate using such a laminate. The patterned substrate thus produced may be used for various electric or electronic elements, a process of forming the pattern, a recording medium such as a magnetic storage medium and a flash memory, or a biosensor, and the like.

The production method may comprise a step of coating a coating liquid comprising a block copolymer, which comprises a polymer segment A satisfying one or more of Conditions 1 to 3 above and a polymer segment B having an absolute value of a difference in surface energy with the polymer segment A of 10 mN/m or less, on the polymer stripe pattern of the substrate that the polymer stripe pattern is formed on its surface, and forming a self-assembled structure of the block copolymer.

As described above, the polymer of the polymer stripe pattern may be a polymer which satisfies one or more of Conditions 1 to 3 above, or has an absolute value of the difference in surface energy with the polymer segment A of 10 mN/m or less.

Here, the method of forming the stripe pattern on the substrate is not particularly limited. For example, the pattern may be produced by a method comprising steps of: (1) forming a polymer film on a substrate; (2) forming a resist film on the polymer film and patterning the resist film; and (3) etching the polymer film using the patterned resist film as a mask.

Here, the polymer film may be formed using the above-described polymer, that is, the polymer containing the above-described unit of Formula 1 or 2 as a main component, or the polymer containing the above-described unit of Formula 3 or 4 as a main component.

Upon forming such a polymer film, for example, a step of coating a polymer film and holding the relevant polymer film at a temperature in a range of about 100° C. to 300° C. for about 1 minute to 100 minutes may also be performed.

Here, an antireflection layer may be formed between the polymer film and the resist film. The antireflection layer may be formed of SiARC using, for example, a silicon material (Si), and in addition to this, all other known materials may be applied. The antireflection layer may be formed by a known coating or vapor deposition method.

The resist film may be formed using a known material, for example, a material that can be patterned by a known lithographic process. Such a resist film can be patterned by a known lithographic process, and the resist film thus patterned can be applied as a mask in the subsequent process of forming a polymer stripe pattern. The patterning of the resist film can be performed so that the dimensions of the polymer stripe pattern can be adjusted to a desired level in a subsequent etching process.

Following the patterning of the resist film, an etching process in which the patterned resist film is applied as an etch mask can be performed. In this etching process, the polymer film and the antireflection layer in the region excluding the region protected by the etch mask can be etched. This etching can be performed by a known etching method, and for example, can be performed by an RIE (reactive ion etching) method. The above-described polymer stripe pattern can be formed by this etching. The etching may also be performed until the polymer film of the region not protected by the etch mask is all removed, or may be formed so as to leave a part of the polymer film.

After the polymer stripe pattern is formed in the above-described manner, the resist film can be removed in a known manner.

The method of forming the polymer film comprising the block copolymer on the substrate that the polymer pattern is formed in the above manner and forming the self-assembled structure of the block copolymer in the polymer film is not particularly limited.

For example, the method may comprise a process of coating the block copolymer or a coating liquid comprising the same to form a layer and annealing the layer. Here, the annealing process may be a thermal annealing process or a solvent annealing process.

The thermal annealing may be performed based on, for example, the phase transition temperature or the glass transition temperature of the block copolymer, and may be performed at, for example, a temperature above the glass transition temperature or the phase transition temperature. The time for which this thermal annealing is performed is not particularly limited, and the treatment can be performed within a range of, for example, about 1 minute to 72 hours, but the time can be changed as needed. In the thermal annealing process, the heat treatment temperature may be, for example, about 100° C. to 250° C., but this may be changed in consideration of the block copolymer to be used. In addition, the solvent annealing process may also be performed in an appropriate non-polar solvent and/or polar solvent at room temperature for about 1 minute to 72 hours.

The method for producing a patterned substrate may further perform a step of selectively removing any one polymer segment of the block copolymer in which the self-assembly structure is formed as above.

For example, it may comprise a process of selectively removing the polymer segment A or B of the block copolymer in the laminate. The production method may comprise selectively removing one or more polymer segments of the block copolymer, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, a copolymer different from the block copolymer or a homopolymer, and the like may be mixed for pattern formation.

The method of selectively removing any one polymer segment of the block copolymer in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

Following the ultraviolet irradiation, a step of treating the polymer film with an acid or the like to further remove the segment decomposed by ultraviolet may also be performed.

The step of etching the substrate using the polymer film in which the polymer segments are selectively removed as a mask is not particularly limited, which may be performed, for example, through a reactive ion etching step using $CF_4$/Ar ions or the like and following this process, a step of removing the polymer film from the substrate by an oxygen plasma treatment or the like may also be performed.

Advantageous Effects

The present application can provide a laminate which is capable of forming a highly aligned block copolymer on a substrate and thus can be effectively applied to production of various patterned substrates, and a method for producing a patterned substrate using the same.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement (CDCl$_3$) to a concentration of about 10 mg/ml, and chemical shifts were expressed in ppm.

<Application Abbreviation> br=broad signal, s=singlet, d=doublet, dd=double doublet, t=triplet, dt=double triplet, q=quartet, p=quintet, m=multiplet.

2. GPC (Gel Permeation Chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>

Instrument: 1200 series from Agilent Technologies

Column: using two PLgel mixed B from Polymer Laboratories

Solvent: THF

Column temperature: 35° C.

Sample concentration: 1 mg/mL, 200 L injection

Standard sample: polystyrene (Mp: 3900000, 723000, 316500, 52200, 31400, 7200, 3940, 485)

3. GISAXS (Grazing Incidence Small Angle X-Ray Scattering)

The grazing incidence small angle X-ray scattering (GISAXS) analysis was performed using a Pohang accelerator 3C beamline. The block copolymer to be analyzed was diluted in fluorobenzene to a solid concentration of about 0.7 wt % to prepare a coating liquid, and the coating liquid was spin-coated on a base material to a thickness of about 5 nm. The coating area was adjusted to 2.25 cm$^2$ or so (width: 1.5 cm, height: 1.5 cm). The coated polymer film was dried at room temperature for about 1 hour and thermally annealed again at about 160° C. for about 1 hour to induce a phase separation structure. Subsequently, a film, in which the phase separation structure was formed, was formed. After an X-ray was incident on the film at an incident angle in a range of about 0.12 degrees to 0.23 degrees corresponding to the angle between the critical angle of the film and the critical angle of the base material, an X-ray diffraction pattern, which was scattered from the film to a detector (2D marCCD) and exited, was obtained. At this time, the distance from the film to the detector was selected as such a range that the self-assembly pattern formed on the film was well observed within a range of about 2 m to 3 m. As the base material, a base material having a hydrophilic surface (a silicon substrate treated with a piranha solution and having a room temperature wetting angle of about 5 degrees to pure water) or a base material having a hydrophobic surface (a silicon substrate treated with HMDS (hexamethyldisilazane) and having a room temperature wetting angle of about 60 degrees to pure water) was used.

4. XRD Analysis Method

The XRD analysis was performed by transmitting X rays to a sample at a Pohang accelerator 4C beamline to measure the scattering intensity according to the scattering vector (q).

As the sample, a polymer in a powder state dried by purifying a synthesized polymer without special pretreatment and then maintaining it in a vacuum oven for one day or so, was placed in a cell for XRD measurement and used. Upon the XRD pattern analysis, an X-ray with a vertical size of 0.023 mm and a horizontal size of 0.3 mm was used and a 2D marCCD was used as a detector. A 2D diffraction pattern scattered and exited was obtained as an image. The obtained diffraction pattern was analyzed by a numerical analytical method to which a least-square method was applied to obtain information such as a scattering vector and a half-value width. Upon the analysis, an origin program was applied, and the profile of the XRD patterns was subjected to Gaussian fitting in a state where a portion showing the smallest intensity in the XRD diffraction patterns was taken as a baseline and the intensity in the above was set to zero, and then the scattering vector and the half-value width were obtained from the fitted results. The R square was set to be at least 0.96 or more upon Gaussian fitting.

5. Measurement of Surface Energy

The surface energy was measured using a drop shape analyzer (DSA100 product from KRUSS). A coating liquid was prepared by diluting the substance (polymer), which is measured, in fluorobenzene to a solid concentration of about 2 wt %, and the prepared coating liquid was spin-coated on a silicon wafer to a thickness of about 50 nm and a coating area of 4 cm$^2$ (width: 2 cm, height: 2 cm). The coating layer was dried at room temperature for about 1 hour and then subjected to thermal annealing at about 160° C. for about 1 hour. The process of dropping the deionized water whose surface tension was known on the film subjected to thermal annealing and obtaining the contact angle thereof was repeated five times to obtain an average value of the obtained five contact angle values. In the same manner, the process of dropping the diiodomethane whose surface tension was known thereon and obtaining the contact angle thereof was repeated five times to obtain an average value of the obtained five contact angle values. The surface energy was obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer was obtained for a homopolymer made of only the monomer forming the polymer segment by the above-described method.

6. GIWAXS (Grazing Incidence Wide Angle X-Ray Scattering)

The grazing incidence wide angle X-ray scattering (GIWAXS) analysis was performed using a Pohang accelerator 3C beamline. The homopolymer to be analyzed was diluted in toluene to a solid concentration of about 1 wt % to prepare a coating liquid, and the coating liquid was spin-coated on a base material to a thickness of about 30 nm. The coating area was adjusted to about 2.25 cm$^2$ (width: 1.5 cm, height: 1.5 cm). The coated polymer film was dried at room temperature for about 1 hour and then subjected to thermal annealing at a temperature of about 160° C. for about 1 hour to form a film. After an X-ray was incident on the film at an incident angle in a range of about 0.12 degrees to 0.23 degrees corresponding to the angle between the critical angle of the film and the critical angle of the base material, an X-ray diffraction pattern, which was scattered from the film to a detector (2D marCCD) and exited, was obtained. At this time, the distance from the film to the detector was selected as such a range that the crystal or liquid crystal structure formed on the film was well observed within a range of about 0.1 m to 0.5 m. As the base material, a silicon substrate treated with a piranha solution and having a room temperature wetting angle of about 5 degrees to pure water was used. In the GIWAXS spectrum, the scattering intensity in the azimuthal angle range of −90 degrees to 90 degrees of the diffraction pattern in the range of 12 nm$^{-1}$ to 16 nm$^{-1}$ (azimuthal angle when the upward direction of the diffraction pattern (out-of-plane diffraction pattern) is set as 0 degrees) was plotted, and the half-value width was obtained from the graph through Gauss fitting. Furthermore, when half of the peak was observed upon Gauss fitting, twice the value of the obtained half-value width (FWHM) was defined as the half-value width of the peak.

7. DSC Analysis

The DSC analysis was performed using PerkinElmer DSC800 equipment. Using the equipment, it was performed by a method in which the sample to be analyzed was heated at a speed of 10° C. per minute from 25° C. to 200° C., cooled again at a speed of −10° C. per minute from 200° C. to −80° C., and raised at a speed of 10° C. per minute from −80° C. to 200° C. under a nitrogen atmosphere to obtain an endothermic curve. The obtained endothermic curve was analyzed to obtain a temperature (melting transition temperature, Tm) indicating a melting transition peak or a temperature (isotropic transition temperature, Ti) indicating an isotropic transition peak, and the area of the peak was obtained. Here, the temperature was defined as the temperature corresponding to the apex of each peak. The area per unit mass of each peak is defined as the value obtained by dividing the area of each peak by the mass of the sample, and this calculation can be calculated using the program provided by the DSC equipment.

Preparation Example 1. Synthesis of Monomer (A)

A monomer (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through MgSO$_4$ to be dehydrated. Subsequently, the target product (4-dodecyloxyphenol) (9.8 g, 35.2 mmol) in a white solid phase was obtained in a yield of about 37% using dichloromethane in column chromatography.

<NMR Analysis Result>

$^1$H-NMR (CDCl$_3$): d6.77 (dd, 4H); δd4.45 (s, 1H); d3.89 (t, 2H); d1.75 (p, 2H); d1.43 (p, 2H); d1.33-1.26 (m, 16H); d0.88 (t, 3H).

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) generated during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the target product (7.7 g, 22.2 mmol) in a white solid phase in a yield of 63%.

<NMR Analysis Result>

$^1$H-NMR (CDCl$_3$): d7.02 (dd, 2H); δd6.89 (dd, 2H); d6.32 (dt, 1H); d5.73 (dt, 1H); d3.94 (t, 2H); δd 2.05 (dd, 3H); d1.76 (p, 2H); δd1.43 (p, 2H); 1.34-1.27 (m, 16H); d0.88 (t, 3H).

[Formula A]

In Formula A, R is a linear alkyl group having 12 carbon atoms.

GIWAXS, XRD and DSC Analyses

Figure 2:
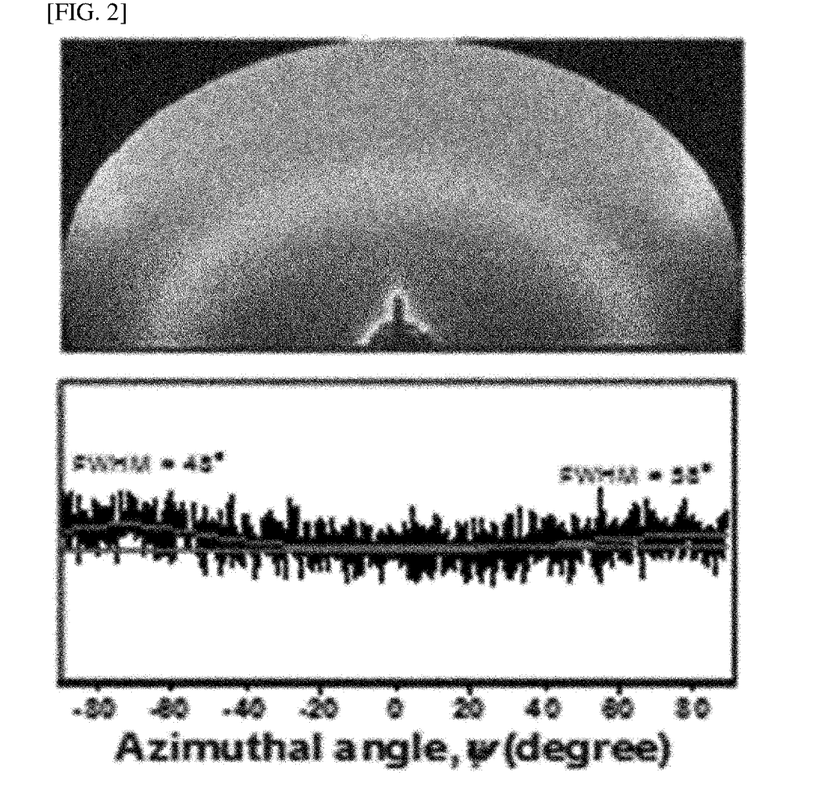
FIG. 2 is a view showing the analysis results of GIWAXS of a homopolymer prepared using the monomer of Preparation Example 1.

A homopolymer was prepared using the monomer (A) of Preparation Example 1, and GIWAXS and DSC were analyzed for the prepared homopolymer. Here, the homopolymer was prepared by a method of synthesizing a macromonomer using the monomer (A) in the following examples. FIG. 2 shows the results of GIWAXS analysis of the homopolymer. In FIG. 2, R square (R square) was about 0.264 upon Gauss fitting. As a result of the DSC analysis for the homopolymer, the corresponding polymer showed a melting temperature of about −3° C. and an isotropic transition temperature of about 15° C. Also, the ratio (M/I) of the area (M) of the melting transition peak to the area (I) of the isotropic transition peak in the DSC analysis of the homopolymer was about 3.67, the half-value width of the peak in an azimuthal angle of −90 degrees to −70 degrees of the diffraction pattern of the scattering vector in a range of 12 nm$^{-1}$ to 16 nm$^{-1}$ in GIWAXS was about 48 degrees, and the half-value width of the peak in an azimuthal angle of 70 degrees to 90 degrees of the diffraction pattern of the scattering vector in a range of 12 nm$^{-1}$ to 16 nm$^{-1}$ in GIWAXS was about 58 degrees. Furthermore, in the X-ray diffraction analysis (XRD), a peak having a half-value width of about 0.57 nm$^{-1}$ or so was observed at a scattering vector value of 1.96 nm$^{-1}$.

Preparation Example 2. Synthesis of Block Copolymer 2.0 g of the monomer (A) of Preparation Example 1, 64 mg of cyanoisoproyl dithiobenzoate as an RAFT (reversible addition-fragmentation chain transfer) reagent, 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 82.6 wt % and the number average molecular weight (Mn) and molecular weight distribution (Mw/Mn) were 9,000 and 1.16, respectively. 0.3 g of the macro initiator, 2.7174 g of a pentafluorostyrene monomer and 1.306 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 250 mL of methanol as an extraction solvent, and then filtered under reduced pressure and dried to prepare a pale pink polymer segment copolymer. The yield of the block copolymer was about 18 wt %, and the number average molecular weight (Mn) and the molecular weight distribution (Mw/Mn) were 14,800 and 1.13, respectively. The block copolymer comprises a polymer segment A, which is derived from the monomer (A) of Preparation Example 1 and has 12 chain-forming atoms (the number of carbon atoms of R in Formula A), and a polymer segment B derived from the pentafluorostyrene monomer. Here, the volume fraction of the polymer segment A was about 0.45, and the volume fraction of the polymer segment B was about 0.55. The surface energy and density of the polymer segment A of the block copolymer were 30.83 mN/m and 1 g/cm$^3$, respectively, and the surface energy and density of the polymer segment B were 24.4 mN/m and 1.57 g/cm$^3$, respectively. Also, the result obtained by substituting the number of chain-forming atoms (12) in the polymer segment A of the block copolymer and the scattering vector value (q) in which the peak having the largest peak area was identified in the scattering vector range of 0.5 nm$^{-1}$ to 10 nm$^{-1}$ upon the X-ray diffraction analysis into the equation nq/(2×π), respectively, was about 3.75.

Preparation Example 3. Synthesis of Stripe Pattern Polymer (D1)

2.77 g of the monomer (A) of Preparation Example 1, 0.14 g of glycidyl methacrylate, 0.16 g of AIBN (azobisisobutyronitrile) and 7.5 mL of tetrahydrofuran (THF) were placed in a 10 mL flask, and a free radical polymerization reaction was performed at 60° C. for 12 hours under a nitrogen atmosphere. After the polymerization, the reaction solution was precipitated in 250 mL of methanol as an extraction solvent, and then filtered under reduced pressure and dried to prepare a polymer. The number average molecular weight (Mn) of the polymer (D1) for the stripe pattern was determined to be 26,500 g/mol.

Preparation Example 4. Synthesis of Stripe Pattern Polymer (D2)

1.25 g of PFS (pentafluorostyrene), 0.14 g of glycidyl methacrylate, 0.16 g of AIBN (azobisisobutyronitrile) and 2 mL of tetrahydrofuran (THF) were placed in a 10 mL flask, and a free radical polymerization was performed at 60° C. for 12 hours under a nitrogen atmosphere. The relevant synthesis was performed in the same manner as in Preparation Example 3. The number average molecular weight (Mn) of the polymer (D2) for the stripe pattern was determined to be 59,400 g/mol.

Preparation Example 5. Synthesis of Stripe Pattern Polymer (D3)

1.25 g of the monomer (A) of Preparation Example 1, 0.14 g of glycidyl methacrylate, 0.16 g of AIBN (azobisisobutyronitrile) and 0.8 mL of tetrahydrofuran (THF) were placed in a 10 mL flask, and a free radical polymerization reaction was performed at 60° C. for 12 hours under a nitrogen atmosphere. The relevant synthesis was performed in the same manner as in Preparation Example 3. The number average molecular weight (Mn) of the polymer (D3) for the stripe pattern was determined to be 99,500 g/mol.

Preparation Example 6. Synthesis of Stripe Pattern Polymer (D4)

1.25 g of PFS (pentafluorostyrene), 0.14 g of glycidyl methacrylate, 0.16 g of AIBN (azobisisobutyronitrile) and 0.5 mL of tetrahydrofuran (THF) were placed in a 10 mL flask, and a free radical polymerization reaction was performed at 60° C. for 12 hours under a nitrogen atmosphere. The relevant synthesis was performed in the same manner as in Preparation Example 3. The number average molecular weight (Mn) of the polymer (D4) for the stripe pattern was determined to be 110,500 g/mol.

Preparation Example 7. Synthesis of Stripe Pattern Polymer (D5)

2.77 g of the monomer (A) of Preparation Example 1, 0.14 g of glycidyl methacrylate, 0.16 g of AIBN (azobisisobutyronitrile) and 20 mL of tetrahydrofuran (THF) were placed in a 50 mL flask, and a free radical polymerization reaction was performed at 60° C. for 12 hours under a nitrogen atmosphere. The relevant synthesis was carried out in the same manner as in Preparation Example 3. The number average molecular weight (Mn) of the polymer (D5) for the stripe pattern was determined to be 17,200 g/mol.

Preparation Example 8. Synthesis of Stripe Pattern Polymer (D6)

2.77 g of the monomer (A) of Preparation Example 1, 0.14 g of glycidyl methacrylate, 0.16 g of AIBN (azobisisobutyronitrile) and 26 mL of tetrahydrofuran (THF) were placed in a 50 mL flask, and a free radical polymerization reaction was performed at 60° C. for 12 hours under a nitrogen atmosphere. The relevant synthesis was performed in the same manner as in Preparation Example 3. The number average molecular weight (Mn) of the polymer (D6) for the stripe pattern was determined to be 10,200 g/mol.

Preparation Example 9. Synthesis of Stripe Pattern Polymer (D7)

2.77 g of PFS (pentafluorostyrene), 0.14 g of glycidyl methacrylate, 0.16 g of AIBN (azobisisobutyronitrile) and 35 mL of tetrahydrofuran (THF) were placed in a 50 mL flask, and a free radical polymerization reaction was performed at 60° C. for 12 hours under a nitrogen atmosphere. The relevant synthesis was performed in the same manner as D1 of Preparation Example 3. The number average molecular weight (Mn) of the polymer (D7) for the stripe pattern was determined to be 4,300 g/mol.

Example 1.

A polymer stripe pattern was formed on a silicon wafer substrate in the following manner. First, the polymer (D6) of Preparation Example 8 was coated to a thickness of about 10 nm on the substrate at the end and thermally annealed at 200° C. for 5 minutes to form a polymer film. The coating was performed by spin-coating a coating liquid prepared by dissolving the polymer (D6) in fluorobenzene to a concentration of about 0.5 wt %. A resist film (hydridosilsesquioxane (HSQ), negative-tone resist layer) was formed on the polymer film to a thickness of about 100 nm, and the resist film was patterned by an e-beam lithographic process. Subsequently, the polymer film was etched by an RIE (reactive ion etching) method using the patterned resist film as a mask, and the residue was removed to form a polymer stripe pattern as shown in FIG. 1. The width (W) of the formed pattern was about 10 nm, and the pitch (F) was about 150 nm.

Figure 3:
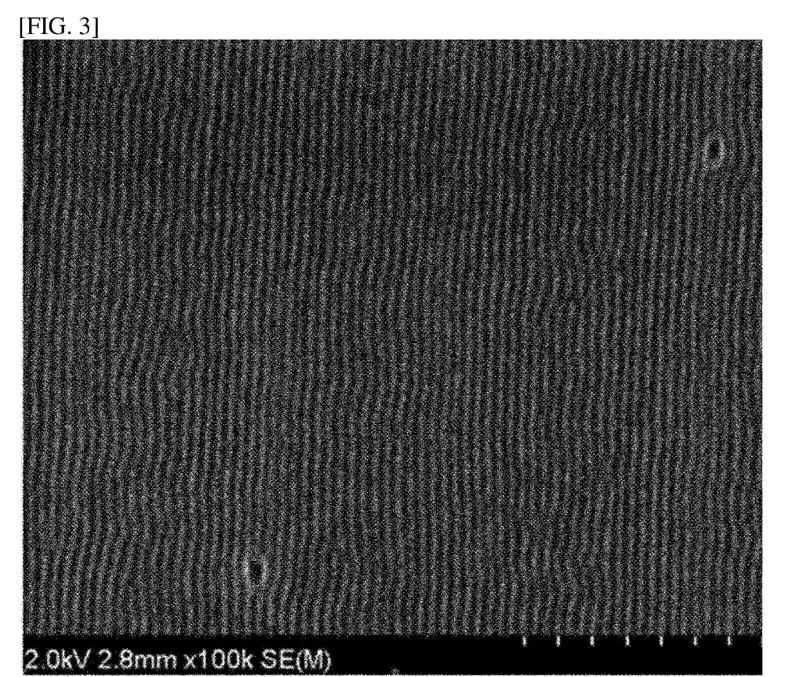
FIGS. 3 to 7 are SEM images of the self-assembled polymer films prepared in the results of Examples 1, 4, and 6, and Comparative Examples 1 and 2, respectively.

A polymer film was formed on the substrate having the pattern formed as above using the block copolymer of Preparation Example 2. Specifically, a coating liquid prepared by diluting the block copolymer in toluene to a solid concentration of about 1.0 wt % was spin-coated on the pattern of the substrate to a thickness of about 25 nm, dried at room temperature for about 1 hour, and thermally annealed at a temperature of 160° C. for about 1 hour to form a self-assembled film. For the formed film, an SEM (scanning electron microscope) image was taken. FIG. 3 is an SEM image of the self-assembled film. The self-assembled film formed a vertically oriented lamellar phase, where the pitch was about 17 nm. It can be confirmed from FIG. 3 that a vertically oriented lamellar pattern with improved linearity by being highly aligned has been appropriately formed.

Example 2.

The process was performed in the same manner as in Example 1, except for using the polymer (D5) of Preparation Example 7 upon forming the polymer stripe pattern. A polymer film was applied, which formed by coating a coating liquid prepared by dissolving the polymer in fluorobenzene to a concentration of about 0.2 wt % on a substrate to a thickness of about 10 nm and thermally annealing it at 200° C. for 5 minutes. As a result of confirmation, as in Example 1, the self-assembled film formed a vertically oriented lamellar phase and a highly aligned structure with improved linearity was derived, where the pitch was about 17 nm.

Example 3.

The process was performed in the same manner as in Example 1, except for using the polymer (D1) of Preparation Example 3 upon forming the polymer stripe pattern. As a result of confirmation, as in Example 1, the self-assembled film formed a vertically oriented lamellar phase and a highly aligned structure with improved linearity was derived, where the pitch was about 17 nm.

Example 4.

Figure 4:
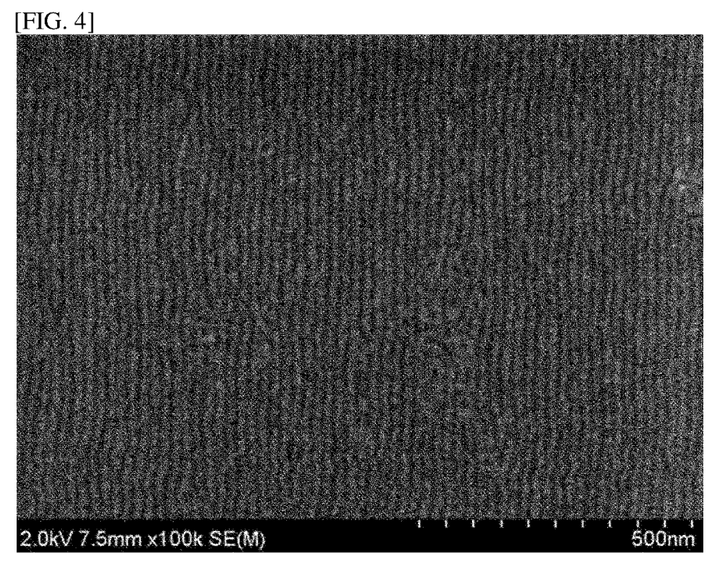

The process was performed in the same manner as in Example 3, provided that after the coating of the polymer D1, the polymer film was formed by thermally annealing it at 140° C. for 5 minutes. FIG. 4 shows the results of the relevant process, and as in Example 1, the self-assembled film formed a vertically oriented lamellar phase and a highly aligned structure with improved linearity was derived, where the pitch was about 17 nm.

Example 5.

The process was performed in the same manner as in Example 1, except that the polymer (D2) of Preparation Example 4 was applied upon forming the polymer stripe pattern, and the thermal annealing for forming the polymer film proceeded at 120° C. for 5 minutes. As a result of confirmation, as in Example 1, the self-assembled film formed a vertically oriented lamellar phase and a highly aligned structure with improved linearity was derived, where the pitch was about 17 nm.

Example 6.

Figure 5:
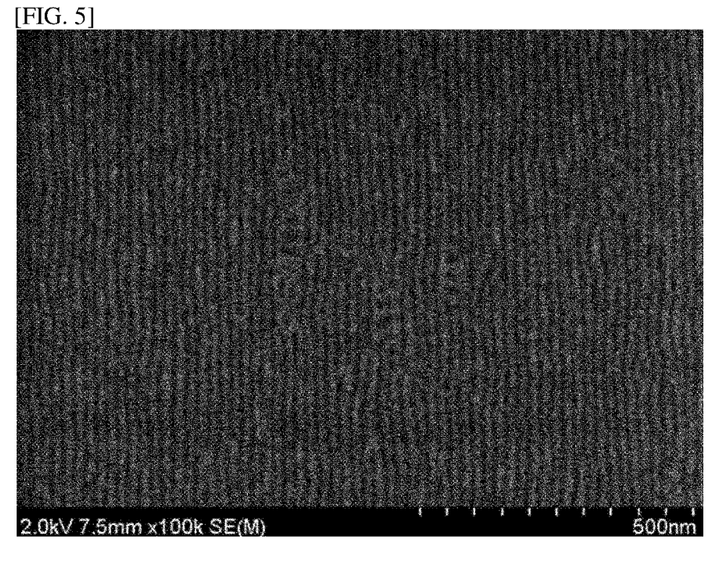

The process was performed in the same manner as in Example 1, except that the polymer (D3) of Preparation Example 5 was applied upon forming the polymer stripe pattern, and the thermal annealing for forming the polymer film proceeded at 100° C. for 5 minutes. FIG. 5 is the result of Example 6, and as a result of confirmation, as in Example 1, the self-assembled film formed a vertically oriented lamellar phase and a highly aligned structure with improved linearity was derived, where the pitch was about 17 nm.

Comparative Example 1.

Figure 6:
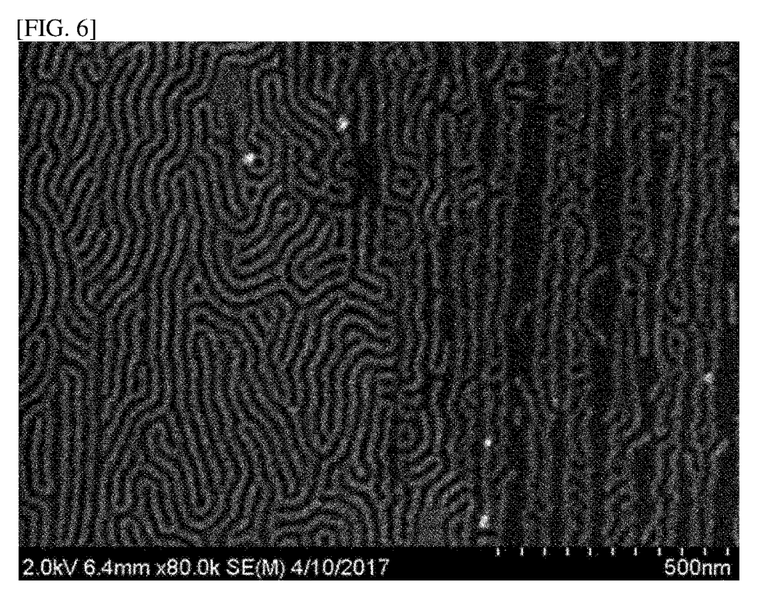

The process was performed in the same manner as in Example 1, except that the polymer (D7) of Preparation Example 9 was applied upon forming the polymer stripe pattern, and the thermal annealing for forming the polymer film proceeded at about 300° C. for 5 minutes. FIG. 6 is the result of Comparative Example 1, and in the case of Comparative Example 1, as a result of confirmation, the highly aligned structure with linearity as Examples was not derived, and the pattern also showed a shape that the horizontal orientation and the vertical orientation were mixed.

Comparative Example 2.

Figure 7:
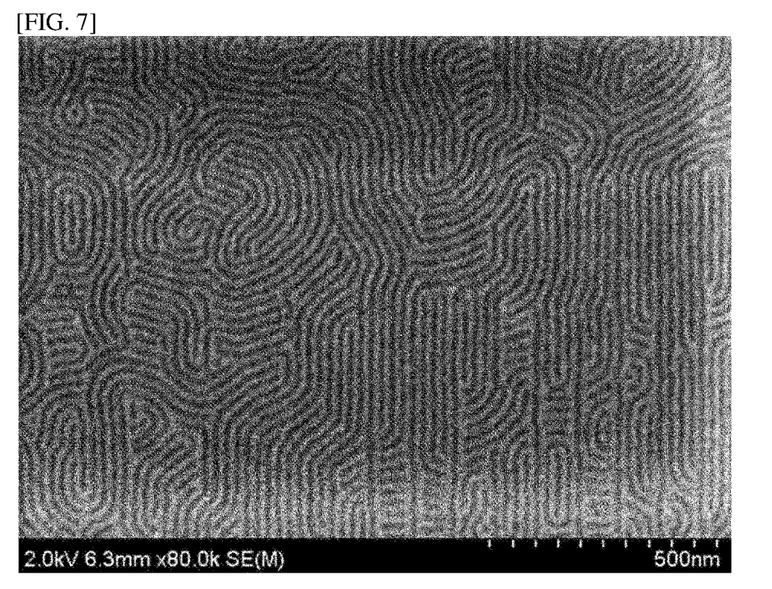

The process was performed in the same manner as in Example 1, except that the polymer (D4) of Preparation Example 6 was applied upon forming the polymer stripe pattern, and the thermal annealing for forming the polymer film proceeded at about 300° C. for 5 minutes. FIG. 7 is the result of Comparative Example 2, and in the case of Comparative Example 2, as a result of confirmation, the highly aligned structure with linearity as Examples was not derived, and the pattern also showed a shape that the horizontal orientation and the vertical orientation were mixed.

The invention claimed is:

1. A method for producing a patterned substrate comprising:
coating a coating liquid on a polymer stripe pattern of a substrate, wherein the coating liquid comprises a block copolymer, which comprises a polymer segment A satisfying one or more of Conditions 1 to 3 below, and a polymer segment B different from the polymer segment A and having an absolute value of a difference between a surface energy of the polymer segment A and a surface energy of the polymer segment B of 10 mN/m or less, and
forming a self-assembled structure of the block copolymer,
wherein the polymer stripe pattern is formed on the surface of the substrate, and the polymer stripe pattern comprises a polymer, which satisfies one or more of Conditions 1 to 3 below, or has an absolute value of a difference between a surface energy of the polymer and the surface energy of the polymer segment A of 10 mN/m or less and a number average molecular weight of 8 Kg/mol to 100 Kg/mol,
Condition 1: it exhibits a melting transition peak or an isotropic transition peak in a range of −80° C. to 200° C. in a differential scanning calorimetry (DSC) analysis,
Condition 2: it exhibits a peak having a half-value width in a range of 0.2 to 0.9 $nm^{-1}$ within a scattering vector (q) range of 0.5 $nm^{-1}$ to 10 $nm^{-1}$ in an X-ray diffraction (XRD) analysis,
Condition 3: it comprises a side chain, which satisfies Equation 1 below:

$$3 \text{ nm}^{-1} \text{ to } 5 \text{ nm}^{-1} = nq/(2 \times \pi) \qquad \text{[Equation 1]}$$

wherein, n is a number of the chain-forming atoms and q is the smallest scattering vector in which a peak is observed or the scattering vector in which a peak of the largest peak area is observed in the XRD analysis, and
wherein the polymer segment A comprises a side chain having 8 or more chain-forming atoms.

2. The method for producing a patterned substrate according to claim 1, wherein the polymer stripe pattern is prepared by a method comprising steps of: (1) forming a polymer film on a substrate; (2) forming a resist film on the polymer film and patterning the resist film; and (3) etching the polymer film using the patterned resist film as a mask.

3. The method for producing a patterned substrate according to claim 1, further performing steps of selectively removing any one polymer segment of the block copolymer on which the self-assembled structure is formed; and etching the substrate using the block copolymer, from which the polymer segment is removed, as a mask.

4. The method for producing a patterned substrate according to claim 1, wherein the polymer segment A in the block copolymer has a volume fraction in a range of 0.4 to 0.8, the polymer segment B has a volume fraction in a range of 0.2 to 0.6, and the sum of the volume fractions of the polymer segments A and B is 1.

5. The method for producing a patterned substrate according to claim 1, wherein the polymer segment A comprises a ring structure and the side chain is substituted on the ring structure directly or via a linker.

6. The method for producing a patterned substrate according to claim 5, wherein no halogen atom is present in the ring structure.

7. The method for producing a patterned substrate according to claim 6, wherein the ring structure is an aromatic or an alicyclic ring.

8. The method for producing a patterned substrate according to claim 1, wherein the polymer segment B comprises three or more halogen atoms.

9. The method for producing a patterned substrate according to claim 8, wherein the polymer segment B comprises a ring structure and the halogen atoms are substituted on the ring structure.

10. The method for producing a patterned substrate according to claim 1, wherein the chain-forming atoms are each independently a carbon, an oxygen, a sulfur or a nitrogen atom.

11. The method for producing a patterned substrate according to claim 5, wherein the linker is an oxygen atom, a sulfur atom, $—NR_1—$, $—S(=O)_2—$, a carbonyl group, an alkylene group, an alkenylene group, an alkynylene group, $—C(=O)—X_1—$ or $—X_1—C(=O)—$, wherein $R_1$ is hydrogen, an alkyl group, an alkenyl group, an alkynyl group, an alkoxy group or an aryl group, and $X_1$ is a single bond, an oxygen atom, a sulfur atom, $—NR_2—$, $—S(=O)_2—$, an alkylene group, an alkenylene group or an alkynylene group, where $R_2$ is hydrogen, an alkyl group, an alkenyl group, an alkynyl group, an alkoxy group or an aryl group.

* * * * *